United States Patent
Lee et al.

(10) Patent No.: US 7,642,561 B2
(45) Date of Patent: Jan. 5, 2010

(54) SEMICONDUCTOR LIGHT EMITTING DIODE HAVING EFFICIENCY AND METHOD OF MANUFACTURING THE SAME

(75) Inventors: Jeong-wook Lee, Yongin-si (KR); Youn-joon Sung, Yongin-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 457 days.

(21) Appl. No.: 11/294,403

(22) Filed: Dec. 6, 2005

(65) Prior Publication Data

US 2006/0118803 A1 Jun. 8, 2006

(30) Foreign Application Priority Data

Dec. 8, 2004 (KR) ............... 10-2004-0103113

(51) Int. Cl.
*H01L 29/22* (2006.01)
(52) U.S. Cl. .................. 257/98; 257/103; 257/E33.068
(58) Field of Classification Search .................. 257/98, 257/103, E33.068
See application file for complete search history.

(56) References Cited

U.S. PATENT DOCUMENTS 6,784,462 B2 8/2004 Schubert

2004/0142503 A1* 7/2004 Lee et al. ...................... 438/47
2006/0118802 A1* 6/2006 Lee et al. ...................... 257/98

FOREIGN PATENT DOCUMENTS

JP 2004-059325 2/2004
KR 10-2004-0067125 A 7/2004

OTHER PUBLICATIONS

Korean Office Action dated Apr. 24, 2006.

* cited by examiner

*Primary Examiner*—Thomas L Dickey
*Assistant Examiner*—Fazli Erdem
(74) *Attorney, Agent, or Firm*—Buchanan Ingersoll & Rooney PC

(57) ABSTRACT

Provided is a semiconductor light emitting diode having a textured structure formed on a substrate. In a method of manufacturing the semiconductor light emitting diode, a metal layer is formed on the substrate, and a metal oxide layer having holes is formed by anodizing the metal layer. The metal oxide layer itself can be used as a textured structure pattern, or the textured structure pattern can be formed by forming holes in the substrate or a material layer under the metal oxide layer corresponding to the holes of the metal oxide layer. The manufacture of the semiconductor light emitting diode is completed by sequentially forming a first semiconductor layer, an active layer, and a second semiconductor layer on the textured structure pattern.

3 Claims, 7 Drawing Sheets

SEMICONDUCTOR LIGHT EMITTING DIODE HAVING EFFICIENCY AND METHOD OF MANUFACTURING THE SAME

CROSS-REFERENCE TO RELATED PATENT APPLICATION

Priority is claimed to Korean Patent Application No. 10-2004-0103113, filed on Dec. 8, 2004, in the Korean Intellectual Property Office, the disclosure of which is incorporated herein in its entirety by reference.

BACKGROUND OF THE INVENTION

1. Field of the Invention

The present invention relates to a semiconductor light emitting diode, and more particularly, to a semiconductor light emitting diode having a textured structure to improve light extraction efficiency, and a method of manufacturing the same.

2. Description of the Related Art

A light emitting diode (LED) converts electrical energy into infrared rays or visible light using the characteristics of a compound semiconductor. The light emitting diode is a kind of electroluminescent (EL) device, and presently, the most widely used light emitting diodes employ an III-V group compound semiconductor.

The III-V group compound semiconductor is typically formed on a substrate formed of sapphire $Al_2O_3$. To improve light emission efficiency, or light extraction efficiency, various LED structures have been proposed. Current studies use a textured structure on a light extraction region of the LED to improve the light extraction efficiency.

Travel of light through an interface between material layers having different refractive indexes is limited by the refractive indices of the material layers. With a flat interface, when light passes from a semiconductor layer having a high refractive index into an air layer having a smaller refractive index (n=1) for instance, the light must enter the flat interface less than a predetermined angle with respect to the normal. If the light enters at an angle greater than the predetermined angle, the light is totally internally reflected at the flat interface, thereby greatly reducing the light extraction efficiency. To avoid the total internal reflection of light, a method of incorporating a textured structure at the interface has attempted.

FIGS. 1A and 1B are cross-sectional views illustrating a conventional light emitting diode having a textured structure. Referring to FIG. 1A, a p-GaN layer 102, an active layer 103, an n-GaN layer 104 are sequentially formed on a p-electrode 101, and an n-electrode 105 is formed on the n-GaN layer 104. When light generated by the active layer 103 is extracted upward through the n-GaN layer 104, a textured structure 106 is incorporated at an interface between the n-GaN layer 104 and the air layer to change the incidence angle of the light.

Referring to FIG. 1B, an n-GaN layer 112 is formed on a sapphire substrate 111, and an n-AlGaN layer 113, an active layer 114, a p-AlGaN layer 115, a p-GaN layer 116, and a p-electrode 117 are sequentially formed on a region of the n-GaN layer 112. An n-electrode 118 is formed on a region of the n-GaN layer 112 where the n-AlGaN layer 113 is not formed. This is a flip-chip structure, in which light generated by the active layer 114 is mainly extracted through the transparent sapphire substrate 111. Here, the light extraction efficiency is improved by forming a textured structure 120 on the surface of the sapphire substrate 111.

A conventional semiconductor light emitting diode incorporates the textured structure 120 to improve the light extraction efficiency. However, particularly as depicted in FIG. 1B, when a GaN group compound semiconductor layer is formed on the sapphire substrate 111, defects can be caused by the unmatched crystal lattice between the sapphire substrate 111 and the GaN group compound semiconductor layer, and can spread to the active layer. The internal crystal defects in the GaN group compound semiconductor layer can reduce the light extraction efficiency. Accordingly, a new type of semiconductor light emitting diode is needed, that can reduce crystal defects and increase the light extraction efficiency.

SUMMARY OF THE INVENTION

Embodiments of the present invention provide a semiconductor light emitting diode having a structure that can prevent the formation of internal structural defects and can increase the light extraction efficiency of the semiconductor light emitting diode.

According to an aspect of the present invention, there is provided a semiconductor light emitting diode having a textured structure, comprising: a substrate; a textured structure layer formed of an anodized metal oxide on the substrate; a first semiconductor layer formed as the textured structure; and an active layer and a second semiconductor layer sequentially formed on the first semiconductor layer and the textured structure layer.

The substrate may be formed of one selected from an inorganic crystal that includes sapphire ($Al_2O_3$), silicon (Si), silicon carbide (SiC), spinel ($MgAl_2O_4$), $NdGaO_3$, $LiGaO_2$, ZnO, or MgO, an III-V group compound semiconductor that includes GaP or GaAs, and an III group nitride compound semiconductor that includes GaN.

The first semiconductor layer, the active layer, and the second semiconductor layer may comprise a nitride semiconductor, for instance.

According to an aspect of the present invention, there is provided a method of manufacturing a semiconductor light emitting diode, comprising: sequentially forming a material layer and a metal layer on a substrate; forming a metal oxide layer having holes by anodizing the metal layer; forming holes in the material layer corresponding to the holes of the metal oxide layer; and sequentially forming a first semiconductor layer, an active layer, and a second semiconductor layer on an upper part of the material layer on the substrate after the metal oxide layer is removed.

The material layer may be formed of one of a transparent insulating material and a transparent conductive material having a refractive index smaller than 2.5.

The transparent insulating material may comprise at least one material selected from $SiO_2$, $SiN_x$, $Al_2O_3$, HfO, $TiO_2$, and ZrO.

The transparent conductive material may comprise at least one material selected from ZnO and In oxide including an additive selected from Mg, Ag, Zn, Sc, Hf, Zr, Te, Se, Ta, W, Nb, Cu, Si, Ni, Co, Mo, and Cr.

According to another aspect of the present invention, there is provided a method of manufacturing a semiconductor light emitting diode having a textured structure, the method comprising: forming a metal layer on a substrate; forming a metal oxide layer having holes by anodizing the metal layer; forming holes in the substrate corresponding to the holes of the metal oxide layer; and sequentially forming a first semiconductor layer, an active layer, and a second semiconductor layer on an upper part of the substrate after the metal oxide layer is removed.

According to still another aspect of the present invention, there is provided a method of manufacturing a semiconductor light emitting diode having a textured structure, the method comprising: forming a metal layer on a substrate; forming a metal oxide layer having holes by anodizing the metal layer; and sequentially forming a first semiconductor layer, an active layer, and a second semiconductor layer on the metal oxide layer

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1A:
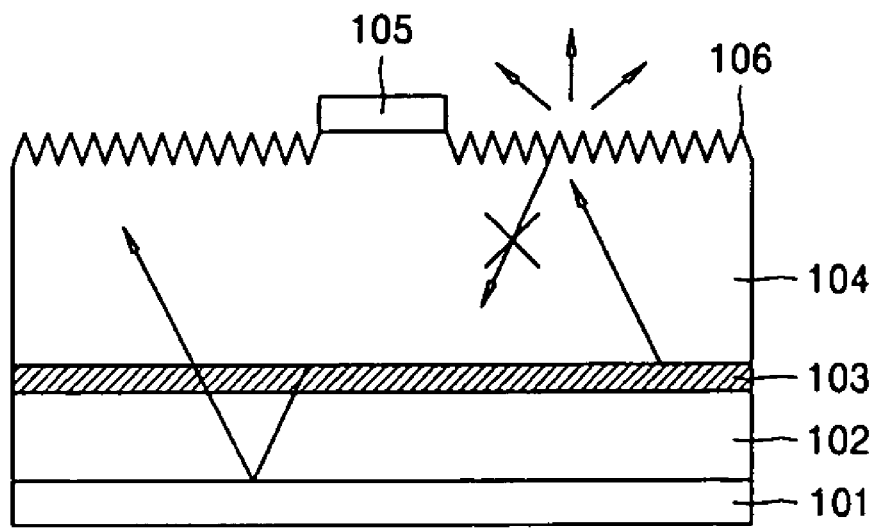
FIGS. 1A and 1B are cross-sectional views of semiconductor light emitting diodes having conventional textured structures.
Figure 1B:
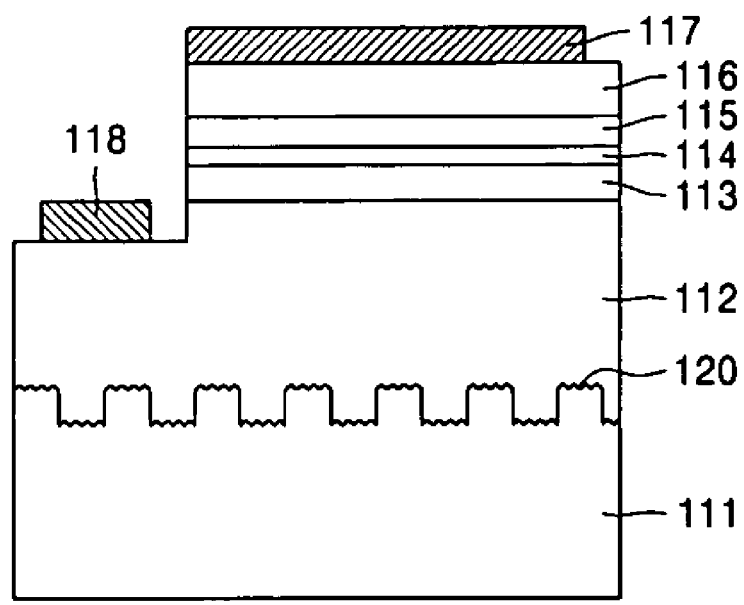
Figure 2:
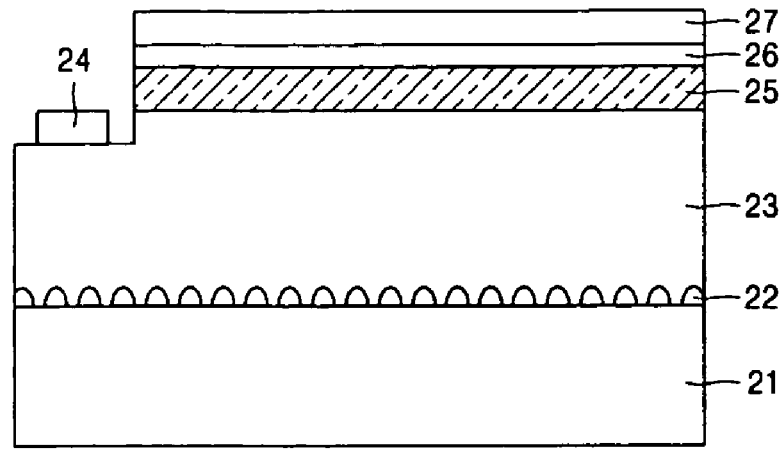
FIG. 2 is a cross-sectional view illustrating the structure of a semiconductor light emitting diode having a textured structure according to an embodiment of the present invention.

FIG. 2 is a cross-sectional view illustrating the structure of a semiconductor light emitting diode having a textured structure according to an embodiment of the present invention. Referring to FIG. 2, a textured structure layer 22 and a first semiconductor layer 23 are formed on a substrate 21. An active layer 25 and a second semiconductor layer 26 are formed on the first semiconductor layer 23, and a first electrode 24 is formed on the first semiconductor layer 23 where the active layer 25 is not formed. A second electrode 27 is formed on the second semiconductor layer 26.

The textured structure layer 22 is formed with a non-planar structure between the substrate 21 and the first semiconductor layer 23. The textured structure layer 22 is incorporated to increase light extraction efficiency by changing the path of incident light generated by the active layer 25. Also, since the first semiconductor layer 23 is formed on a nano pattern like the textured structure layer 22, an abnormal distribution of stresses generated at an interface between the substrate 21 and the textured structure layer 22 due to crystal structure difference is reduced, thereby creating a uniform defect distribution. The textured structure layer 22 can be formed of anodic aluminum oxide (AAO), $SiO_2$, $SiN_x$, or ITO.

The elements of the above structure, except for the textured structure layer 22, can be formed of materials used for forming a conventional semiconductor light emitting diode. The substrate 21 can be formed of one selected from: an inorganic crystal that includes sapphire ($Al_2O_3$), silicon (Si), silicon carbide (SiC), spinel ($MgAl_2O_4$), $NdGaO_3$, $LiGaO_2$, ZnO, or MgO; an III-V group compound semiconductor that includes GaP or GaAs; and an III group nitride compound semiconductor that includes GaN. The first semiconductor layer 23 and the second semiconductor layer 26 can be formed of one selected from GaN, AlGaN, AlInGaN, and InGaNAs.

A method of manufacturing a textured structure of a high efficiency semiconductor light emitting diode according to an embodiment of the present invention will now be described with reference to FIGS. 3A through 3D. In the present embodiment, the textured structure layer is formed of a transparent insulating material or a transparent conductive material having a refractive index of less than 2.5. Here, the transparent insulating material can be $SiO_2$, $SiN_x$, $Al_2O_3$, HfO, TiO2, or ZrO. The transparent conductive material can be transparent conductive oxides, such as ZnO or In oxide including an additive, such as Mg, Ag, Zn, Sc, Hf, Zr, Te, Se, Ta, W, Nb, Cu, Si, Ni, Co, Mo, or Cr.

Figure 3A:
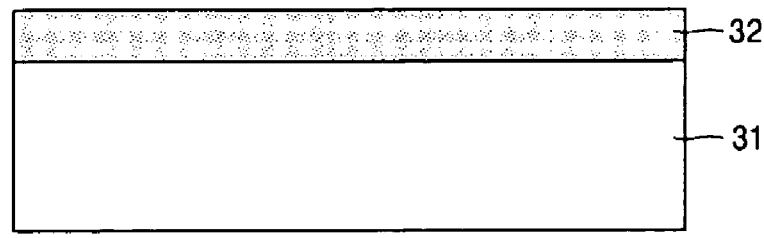
FIGS. 3A through 3D are cross-sectional views for explaining a method of manufacturing a semiconductor light emitting diode according to an embodiment of the present invention.

Referring to FIG. 3A, a material layer 32 is formed on a substrate 31. The material layer 32 is deposited to form the textured structure layer 22 in FIG. 2. The material layer 32 may be formed using a light transmitting material, such as $SiO_2$, $SiN_x$, or ITO.

Figure 3B:
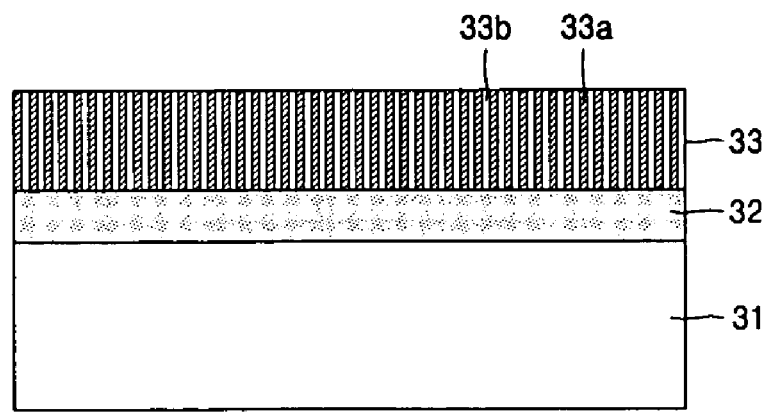

Next, as depicted in FIG. 3B, a metal layer 33 is formed on the material layer 32. A metal oxide layer 33a having a plurality of nano-size holes 33b is formed by anodizing the metal layer 33. Here, the metal layer 33 is formed mainly of aluminum Al, and when this is anodized, a plurality of nano-size holes 33b are formed, from the surface to the inside of the aluminum. The holes 33b preferably have a diameter of approximately 100 nm or less. Next, a nano patterning process is performed on the material layer 32 under the metal oxide layer 33a by dry etching using the metal oxide layer 33a having the plurality of holes 33b as a mask.

Figure 3C:
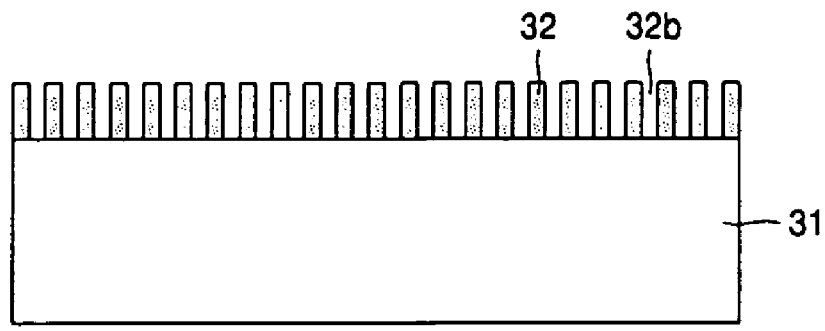

Referring to FIG. 3C, when the nano patterning is performed by dry etching the material layer 32, holes 32a are formed in the material layer 32 corresponding to the holes 33b of the metal oxide layer 33a. When the metal oxide layer 33a is removed, a patterned material layer 32 having a textured structure remains.

Figure 3D:
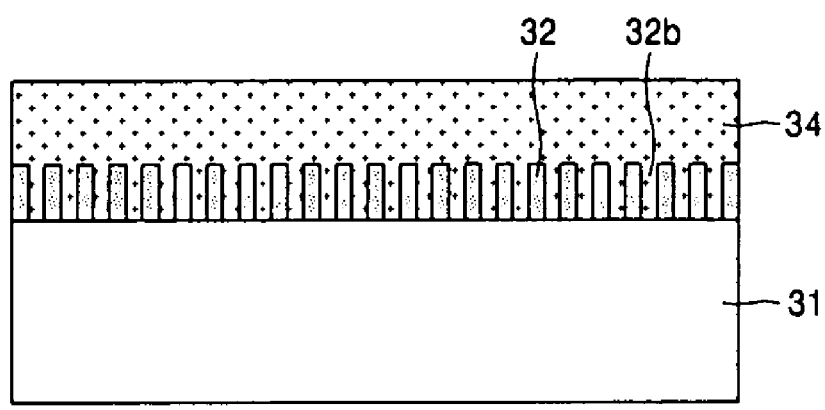

Next, referring to FIG. 3D, a first semiconductor layer 34 is formed by coating a semiconductor material such as GaN on the material layer 32. Accordingly, the textured structure layer 22 of FIG. 2 can be manufactured. An active layer, a second semiconductor layer, and first and second electrodes can be formed on the first semiconductor layer 34 using conventional processes. For example, the active layer, the second semiconductor layer, and the second electrode are sequentially formed on a region of the first semiconductor layer 34, and the first electrode is formed on the first semiconductor layer 34 where the active layer is not formed. Thus, the manufacture of the semiconductor light emitting diode having the structure as depicted in FIG. 2 can be completed. After the textured structure is formed, the substrate 31 is removed, the first electrode is formed, and a vertical type of semiconductor light emitting diode can be formed by forming the active layer, the second semiconductor layer, and the second electrode on the first semiconductor layer 34.

A method of manufacturing a textured structure of a high efficiency semiconductor light emitting diode according to another embodiment of the present invention will now be described with reference to FIGS. 4A through 4C. This is a process for forming a nano pattern corresponding to the textured structure layer 22 of FIG. 2 using a substrate.

Figure 4A:
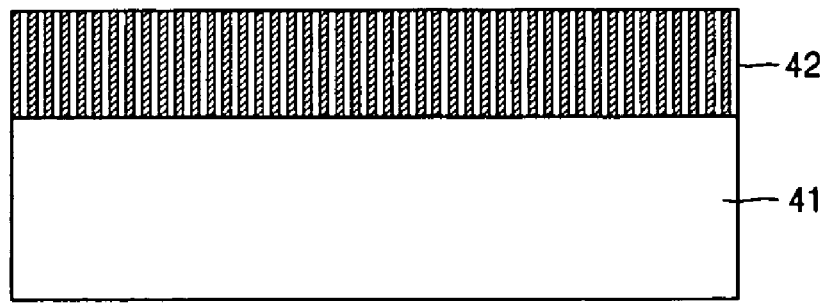
FIGS. 4A through 4C are cross-sectional views for explaining a method of manufacturing a semiconductor light emitting diode according to another embodiment of the present invention.
Figure 4B:
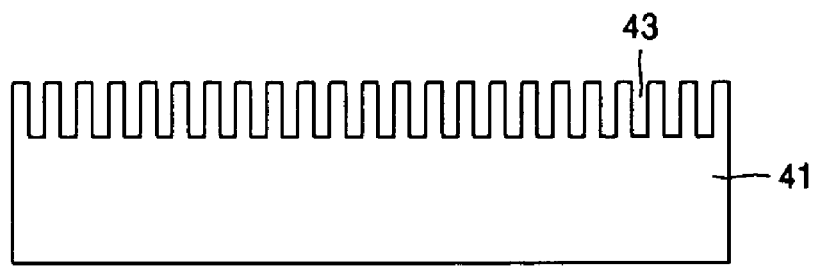

Referring to FIGS. 4A and 4B, a metal oxide layer 42 is formed on a substrate 41. In this process, as described with reference to FIG. 3B, a metal layer is deposited on the substrate 41, and then a plurality of nano size holes are formed by anodizing the metal layer. The metal layer is formed mainly of aluminum Al, and when this is anodized, a plurality of nano-size holes are formed from the surface to the inside of the aluminum. The holes preferably have a diameter of approximately 100 nm or less.

Next, a nano patterning process is performed on the substrate 41 under the metal oxide layer by dry etching using the metal oxide layer 42 having the plurality of holes as a mask. When the nano patterning is performed by dry etching the substrate 41, a plurality of holes 43 are formed in a region of the substrate 41 corresponding to the holes of the metal oxide layer 42. When the metal oxide layer 42 is removed, a patterned textured structure remains on the surface of the substrate 41.

Figure 4C:
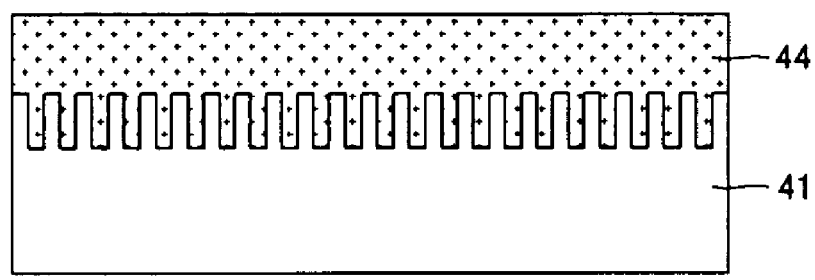

Next, referring to FIG. 4C, a first semiconductor layer 44 is formed by coating a semiconductor material such as GaN on the substrate 41. An active layer, a second semiconductor layer, and first and second electrodes can be formed on the first semiconductor layer 34 using conventional processes. The active layer, the second semiconductor layer, and the second electrode are sequentially formed on a region of the first semiconductor layer 44, and the first electrode is formed on the first semiconductor layer 44 where the active layer is not formed. Thus, the manufacture of the semiconductor light emitting diode having the structure as depicted in FIG. 2 can be completed. After the textured structure is formed, the substrate 41 is removed, the first electrode is formed, and a vertical type of semiconductor light emitting diode can be formed by forming the active layer, the second semiconductor layer, and the second electrode on the first semiconductor layer 44. Consequentially, the manufacture of the semiconductor light emitting diode having the textured structure layer 22 shown in FIG. 2 can be completed.

A method of manufacturing a textured structure of a high efficiency semiconductor light emitting diode according to still another embodiment of the present invention will now be described with reference to FIGS. 5A through 5C. This is a process for forming a nano pattern corresponding to the textured structure layer 22 of FIG. 2 using a metal oxide.

Figure 5A:
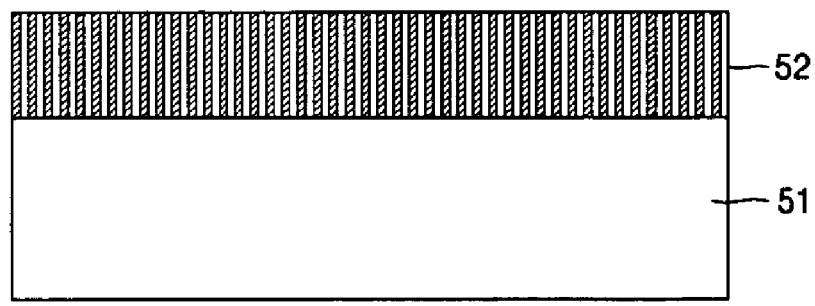
FIGS. 5A through 5C are cross-sectional views for explaining a method of manufacturing a semiconductor light emitting diode according to still another embodiment of the present invention.

Referring to FIG. 5A, a metal oxide layer 52 is formed on a substrate 51. In this process, as described with reference to FIG. 5B, a metal layer is deposited on the substrate 51, and then a plurality of nano size holes are formed by anodizing the metal layer. The metal layer is formed mainly of aluminum Al, and when this is anodized, a plurality of nano-size holes are formed from the surface to the inside of the aluminum.

Figure 5B:
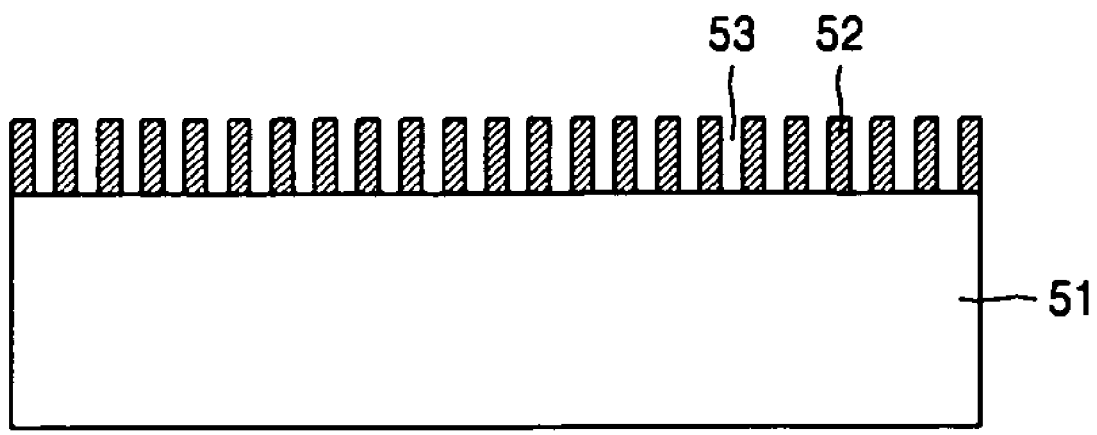

Referring to FIG. 5B, the metal oxide layer 52 having a plurality of holes is leveled to a desired thickness by removing the upper part of the metal oxide layer 52. The metal oxide layer 52 having a required thickness can be formed by depositing the metal layer to a desired thickness and anodizing the metal layer. Thus, the metal oxide layer 52 having a plurality of holes 53 is formed. Finally, the textured structure is formed on the substrate 51.

Figure 5C:
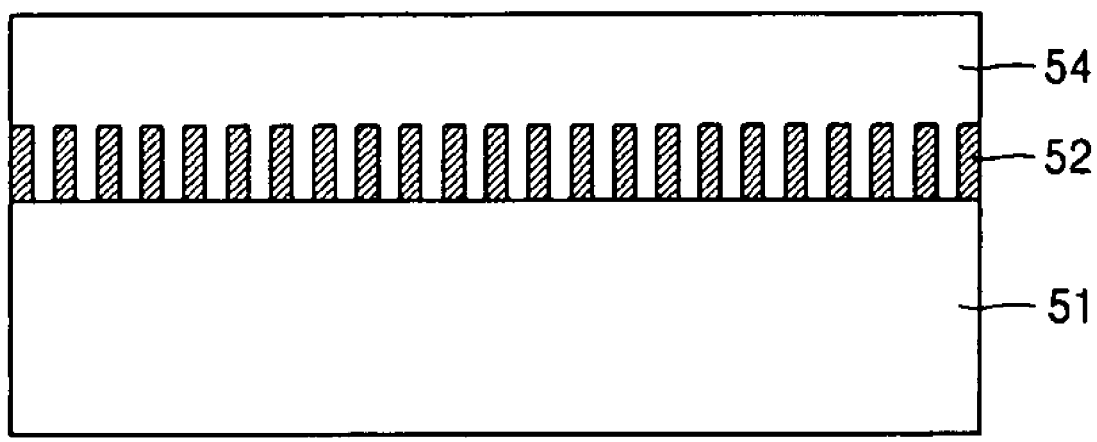

Referring to FIG. 5C, a first semiconductor layer 54 is formed by coating a semiconductor material such as GaN on the substrate 51. Afterward, an active layer, a second semiconductor layer, and first and second electrodes can be formed on the first semiconductor layer 54 using conventional processes as in FIG. 4C. Also, as described above, after the textured structure is formed, the substrate 51 is removed, the first electrode is formed, and the active layer, the second semiconductor layer, and the second electrode are sequentially formed on the first semiconductor layer 54. Consequentially, the semiconductor light emitting diode having the textured structure layer 22 in FIG. 2 can be manufactured.

Figure 6A:
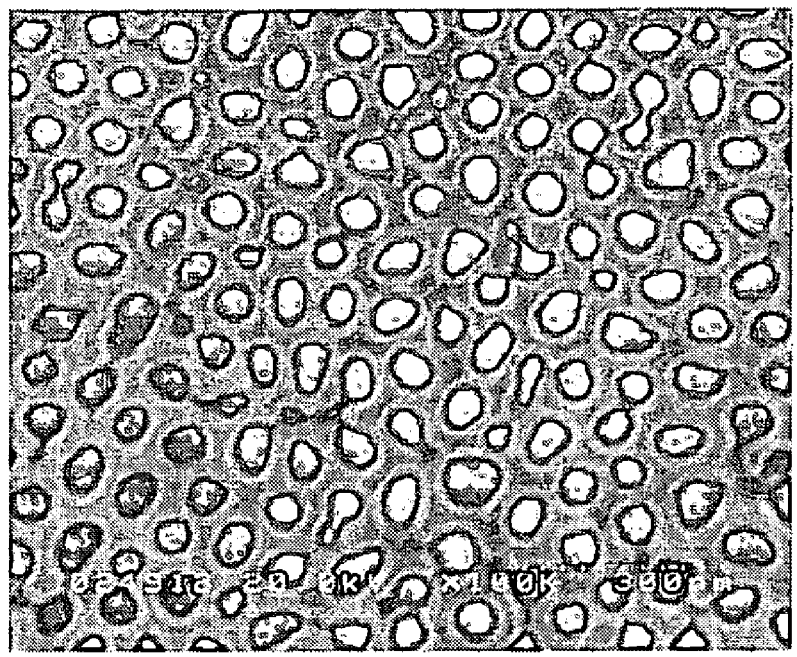
FIGS. 6A through 6C are SEM images taken during the manufacturing of the textured structure according to the embodiments of the present invention.

FIG. 6A is a SEM image taken from the top of a metal oxide layer formed on a substrate. Here, the metal layer is formed of aluminum Al, and holes are formed in the surface of the aluminum by anodizing. A high purity of Al allows a nano pattern having correct hole sizes to be formed.

Figure 6B:
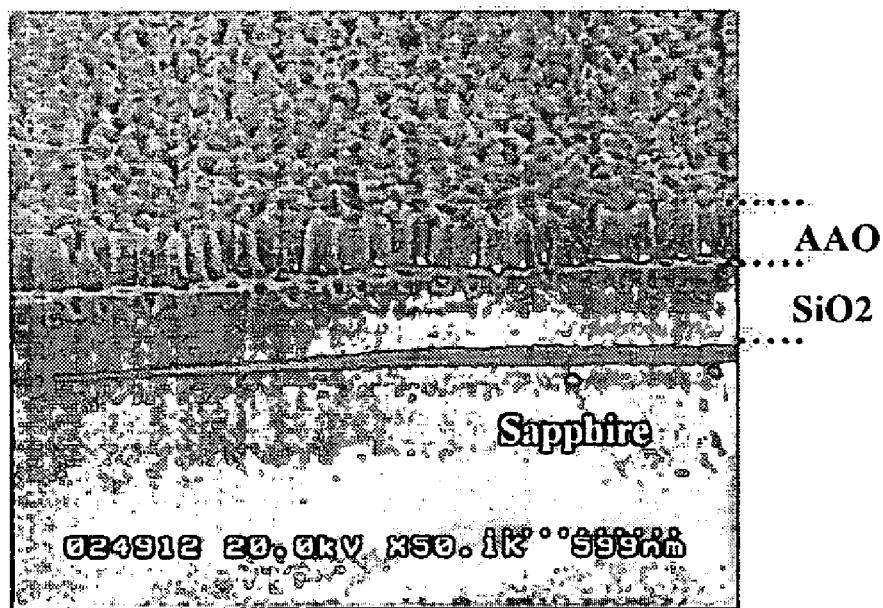

FIG. 6B is a SEM image taken during a manufacturing process of a textured structure of a high efficiency semiconductor light emitting diode according to an embodiment of the present invention. The substrate is formed of sapphire $Al_2O_3$, and the material layer is formed of $SiO_2$. Dry etching the metal oxide layer, having holes formed by anodizing Al, causes holes to form on the surface of the $SiO_2$ material layer.

Figure 6C:
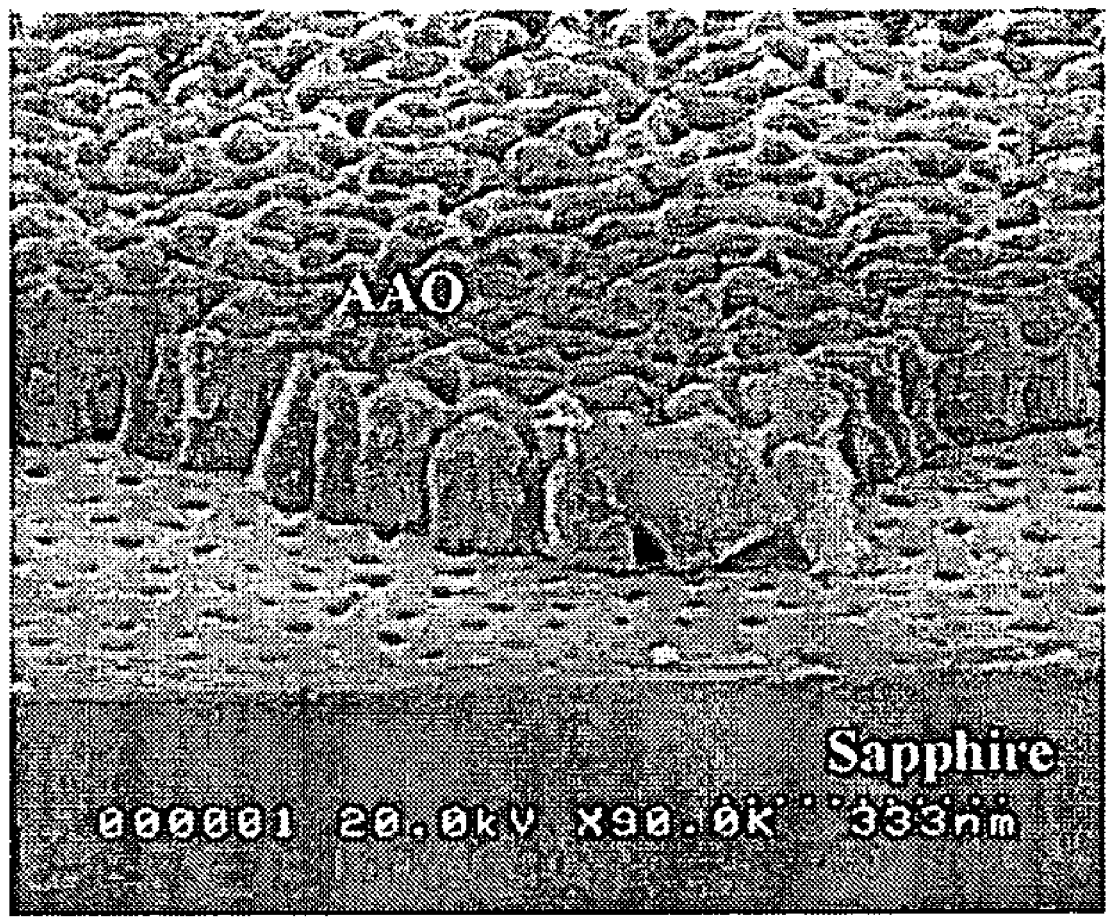

FIG. 6C is a SEM image of a metal oxide layer having a plurality of holes formed on a substrate. Referring to FIG. 6C, holes are formed in the surface of the substrate when the metal oxide layer is dry etched.

According to the present invention, a semiconductor light emitting diode having a high extraction efficiency of light generated by an active layer, and uniform distribution of internal crystal defects, can be manufactured by forming a textured structure pattern in a semiconductor layer of the semiconductor light emitting diode using a simple process, allowing stable operation and increased lifespan of the semiconductor light emitting diode.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A semiconductor light emitting diode having a textured structure, comprising:
   a substrate;
   a textured structure layer formed of a metal oxide on the substrate and having a plurality of holes formed to expose portions of the substrate;
   a first semiconductor layer formed on the textured structure layer and the exposed portions of the substrate; and
   an active layer and a second semiconductor layer sequentially formed on the first semiconductor layer.

2. The semiconductor light emitting diode of claim 1, wherein the substrate is formed of one selected from an inorganic crystal that includes sapphire ($Al_2O_3$), silicon (Si), silicon carbide (SiC), spinel ($MgAl_2O_4$), $NdGaO_3$, $LiGaO_2$, ZnO, or MgO, an Ill-V group compound semiconductor that includes GaP or GaAs, and an Ill group nitride compound semiconductor that includes GaN.

3. The semiconductor light emitting diode of claim 1, wherein the first semiconductor layer, the active layer, and the second semiconductor layer comprise a nitride semiconductor.

* * * * *